United States Patent [19]
Gamand et al.

[11] Patent Number: 5,451,905
[45] Date of Patent: Sep. 19, 1995

[54] MICROWAVE SEMICONDUCTOR DEVICE COMPRISING STABILIZING MEANS

[75] Inventors: Patrice Gamand, Douvres; Christophe Cordier, Limeil-Brevannes, both of France

[73] Assignee: U.S. Philips Corporation, New York, N.Y.

[21] Appl. No.: 239,013

[22] Filed: May 5, 1994

[30] Foreign Application Priority Data

May 18, 1993 [FR] France .................. 93 05997

[51] Int. Cl.[6] ........................... H03F 3/60
[52] U.S. Cl. ........................... 330/286; 333/247
[58] Field of Search ............ 333/32, 33, 247; 330/277, 286, 296

[56] References Cited

U.S. PATENT DOCUMENTS

| | | | |
|---|---|---|---|
| 4,152,680 | 5/1979 | Harrison | 333/218 X |
| 5,229,732 | 7/1993 | Furutani et al. | 330/296 X |

FOREIGN PATENT DOCUMENTS

| | | | |
|---|---|---|---|
| 3192801 | 8/1991 | Japan | H01P 1/00 |
| 129308 | 4/1992 | Japan | 330/286 |
| 326206 | 11/1992 | Japan | 330/286 |

OTHER PUBLICATIONS

Wang et al., "High-Performance W-Band Monolithic Pseudomorphic InGaAs HEMT LNA's and Design/Analysis Methodology", IEEE Transactions on Microwave Theory and Techniques, vol. 40, No. 3, Mar. 1992, pp. 417–428.

1991 IEEE MTT-S International Microwave Symposium Digest, vol. III, Jun. 10–14, 1991, pp. 933–936.

*Primary Examiner*—Paul Gensler
*Attorney, Agent, or Firm*—Robert J. Kraus

[57] ABSTRACT

A semiconductor device microwave integrated circuit includes at least a transistor stage which stage includes a microwave matching circuit and a d.c. bias circuit interconnected at a link node (A). The transistor stage further includes a stabilizing circuit which includes an open stub line connected to the link node. The open stub line connected to the link node is a λ/4 line which at the operating frequency imposes a short circuit on the link node. A matching circuit made up of a low-value resistor connected to ground in the microwave mode through a d.c. isolating capacitor is connected to the link node. A λ/4 line of the radial type (λ/4 radial stub) provides broadband operation.

13 Claims, 2 Drawing Sheets

5,451,905

MICROWAVE SEMICONDUCTOR DEVICE COMPRISING STABILIZING MEANS

FIELD OF THE INVENTION

This invention relates to a semiconductor device comprising a microwave integrated circuit. The device includes at least a transistor stage which stage comprises a microwave matching circuit and a d.c. bias circuit interconnected at a link node, this stage further including stabilizing means which include an open stub line connected to the link node.

The invention finds its application in any broadband microwave circuit, for example, for applications in the field of telecommunications or circuits on board of vehicles.

BACKGROUND OF THE INVENTION

A device as described in the opening paragraph is already known from Japanese Patent Application JP-3-192801-A of 21-12-1989, MITSUBISHI ELECTRIC CORP., Application no. 1-333616, published 22-08-1991). This device comprises a microwave transistor stage (1) which has a microwave input (4), an output (2) via the drain of the transistor whose source is connected to ground, a microwave matching circuit formed by transmission lines (3) and (5) connected to the gate of the transistor (1), and a d.c. bias circuit (6) connected to the matching circuit (3, 5) at the node (13) at the end of the line (5). The d.c. bias circuit first of all comprises a bias resistor (9) connected between the link node (13) and the d.c. power supply (11) and a decoupling capacitor (10) of the d.c. power supply.

The bias circuit (6) disclosed in the cited Japanese Patent Application further includes a short line (19) connected to the link node (13), which line is provided to form a low-value capacitor capable of forming, together with the bias resistor (9), an RC filter which also takes into account the value of the d.c. voltage (11) decoupling capacitor (10).

Thus, in the circuit disclosed in said document the bias resistor (9) is always to be taken into account in the microwave operation. In this frequency domain this resistor cooperates with the capacitors (19, 10) to form a filter.

As disclosed in the Japanese document reflection coefficient or mismatch factor at the operating frequency is close to 1 when viewing the bias circuit (6) from the link node (13). Thus, the possibility for oscillations to appear is diminished.

However, this known circuit has certain drawbacks. First of all, obtaining a mismatch factor (reflection coefficient) close to 1, but nevertheless with a slightly negative factor, is not sufficient to insure stability. As long as a circuit has a negative mismatch factor, the possibility of the occurrence of severe oscillations is not negligible.

On the other hand, the open stub element (19) which is used has a filter function centered on a narrow band. Outside this band, annoying oscillations can be foreseen at lower or higher frequencies.

SUMMARY OF THE INVENTION

It is an object of the invention to provide a circuit as defined in the opening paragraph which comprises means for unconditionally stabilizing the circuit.

It is a further object of the invention to provide such a circuit whose stabilizing means render this circuit unconditionally stable over a very wide frequency range.

These objects are achieved by means of the device defined in the opening paragraph, characterized in that the open stub connected to the link node A is a $\lambda/4$ line at the operating frequency so as to impose the presence of a short-circuit on this link node A, and in that a stabilizing circuit comprising a low-value resistor connected to ground in the microwave mode through a d.c. isolating capacitor is furthermore connected to the link node A.

These stabilizing means are connected to the microwave circuit and provide a short circuit at the link node between the bias circuit and the matching circuit. This provides the advantage that the bias circuit no longer intervenes in the microwave operation over the whole band of the $\lambda/4$ line. Likewise, in this wavelength domain the resistance of the stabilizing circuit is absolutely not to be taken into account.

In contrast, the moment one comes outside the frequency band where the $\lambda/4$ line imposes a short-circuit on the link node A, and where instabilities are to be expected, the resistance of the stabilizing circuit causes oscillations, if any, to be attenuated.

In one embodiment the $\lambda/4$ line is of the radial type ($\lambda/4$ radial stub).

As a result, the advantage of the short-circuit action of this $\lambda/4$ line lies in the broadband area.

The advantages obtained by the circuit according to the invention reside in the fact that the circuit presents a stability factor, at the link node A looking towards the bias circuit, which is always greater than 1, and thus in the fact that it is unconditionally stable. Moreover, these advantages are obtained over a wide passband. Thus, resonance peaks both at the frequencies close to the operating frequency, the frequencies lower than the operating frequency or much higher than the operating frequency, are avoided.

BRIEF DESCRIPTION OF THE DRAWINGS

The invention will be described hereinafter in detail with reference to the appended diagrammatic drawing, in which.

DESCRIPTION OF THE PREFERRED EMBODIMENTS

Figure 1A:
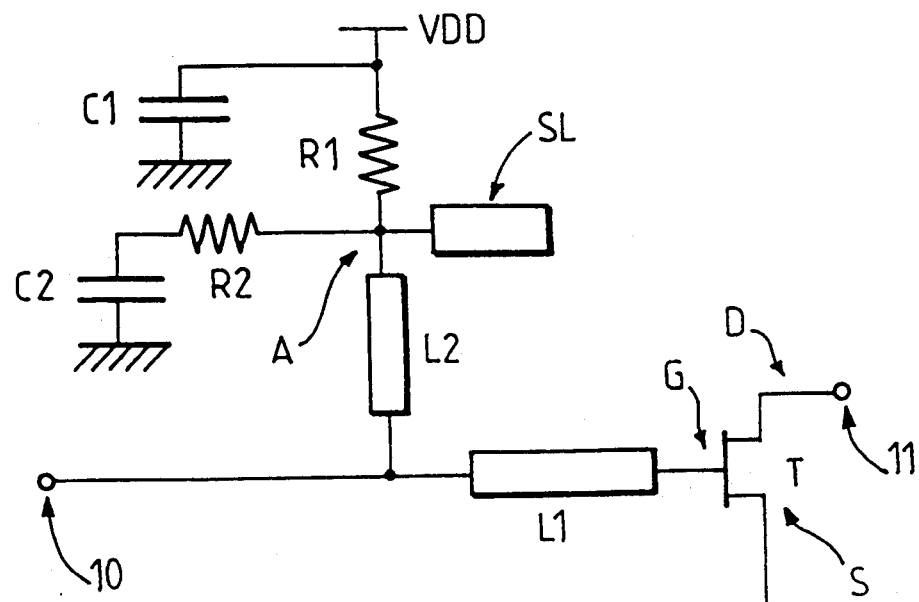
FIG. 1a shows a microwave transistor stage comprising a matching circuit, a bias circuit and stabilizing means according to the invention.

As represented in FIG. 1a, a transistor stage adapted to be integrated in a semiconductor device comprises:
 a matching circuit,
 a bias circuit,
 and stabilizing means.

The transistor stage comprises, for example, a transistor T which has a gate G, a drain D and a source S. A microwave signal is input at node 10 to gate G and the output is derived at node 11 via drain D. The source S is connected to ground.

The matching circuit of the transistor T comprises a transmission line L1 connected between the input node 10 and the gate G of the transistor, and a transmission line L2 having one end connected to the input node 10. The second end of the transmission line L2 of this matching circuit is the node A, which is a link to the bias circuit of the transistor T.

The bias circuit of the transistor T comprises a resistor R1 connected between the link node A and a d.c. power supply VDD. This d.c. power supply is further by-passed to ground by a capacitor C1.

According to the invention, at the link node A forming a link between the matching circuit L1, L2 and the bias circuit R1, C1, a microwave short-circuit to ground is imposed by means of a λ/4 open stub SL at the operating microwave frequency.

Figure 1B:
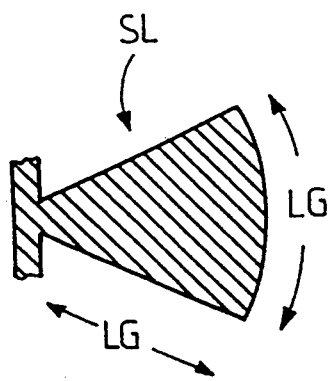
FIG. 1b shows a $\lambda/4$ radial stub.

With reference to FIG. 1b, the line SL is shown as a radial stub and is a metallization in the form of a sector of a circle of which the centre is positioned at the link node A, of which the length LG of the peripheral arc is equal to $\lambda_G/4$, where $\lambda_G$ represents the length of the guided wave corresponding to the operating frequency, and of which the radius LG is also equal to $\lambda_G/4$. The radial stub SL can be realized at the option of a person of ordinary skill in the art of microstrip technology or coplanar technology. In microstrip technology, the conductor is disposed on a face of a substrate, a ground plane is disposed on the opposite surface and the propagation takes into account, in addition to the structure of the conductor and its dimensions, the thickness of the substrate and its characteristic parameters. In coplanar technology the microwave conductor and the ground plane are disposed on the same surface of the substrate. The propagation takes into account, in addition to the structure and the dimensions of the conductor, the distance between the edges of the conductor and the ground plane as well as the characteristic parameters of the substrate.

Figure 1C:
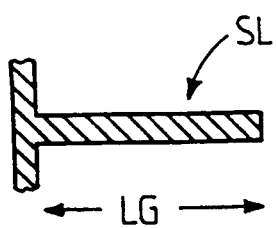
FIG. 1c shows a $\lambda/4$ single stripline.

With reference to FIG. 1c the λ/4 line SL may be a simple strip of length LG with an open end. The difference is that such a λ/4 single line is not a broadband line which, in contrast, is the case with a radial stub.

The circuit according to the invention further includes a stabilizing circuit formed by a resistor R2 having a low resistance, for example, several ω. From this low value the person of ordinary skill in the art may select a resistor of about 5 Ω. This resistor connects the link node A to ground in the microwave mode under certain conditions.

In the frequency domain where the radial stub $\lambda_G/4$ referenced SL imposes a short-circuit on the link node A, the transistor stage effectively does not at all include the bias resistor R1 and neither does it include the stabilizing resistor R2.

In contrast, outside this frequency domain, at lower frequencies and especially at much higher frequencies where oscillations are to be expected, the stabilizing resistor R2 becomes effective and terminates these oscillations.

In practice, the resistor R2 is connected to ground via a d.c. isolation capacitor C2.

Figure 2A:
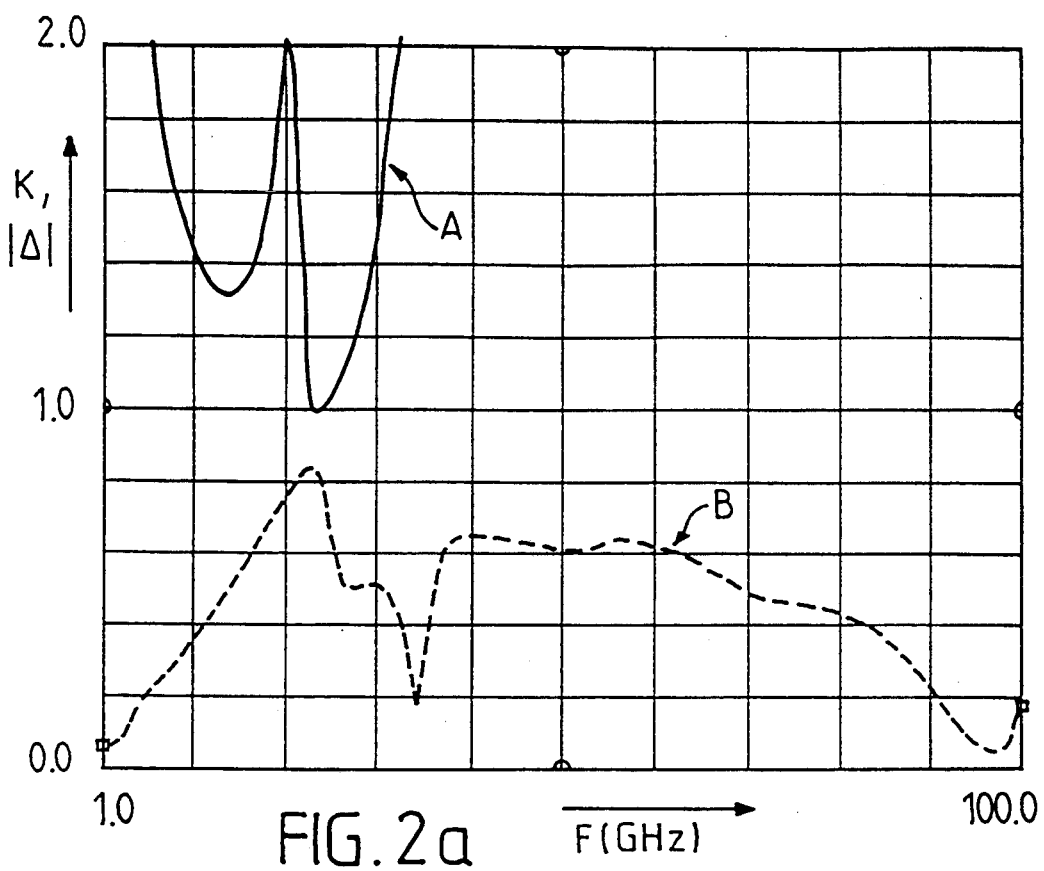
FIG. 2a shows curves representing the stability factor k in a solid line (curve A) and the stability parameter $|\Delta|$ in a dashed line (curve B) of a circuit not comprising the stabilizing circuit R2, C2, plotted against frequency in GHz.

With reference to FIG. 2a, which shows in a solid line in curve A the stability factor k for a device as shown in FIG. 1a comprising a short-circuit formed by a radial stub SL, but not including the stabilizing circuit R2, C2, it appears that this factor k falls below the critical value of "1" for an operating frequency F of the order of 25 GHz.

With reference to FIG. 2a which shows in a dashed line in curve B another parameter $|\Delta|$ which characterizes the stability defined, in terms of S-parameters, by:

$$|\Delta| = |(S11\, S22) - (S12\, S21)|$$

for an identical device which does not comprise the stabilizing circuit R2, C2, a peak appears which is characteristic of a resonance at the 25 GHz operating frequency F. As is well known, the S-parameter S11 is the input reflection coefficient, S22 is the output reflection coefficient, S21 is the transmission coefficient from the input to the output, and S12 is the transmission coefficient from the output to the input in the apparatus of FIG. 1a.

Figure 2B:
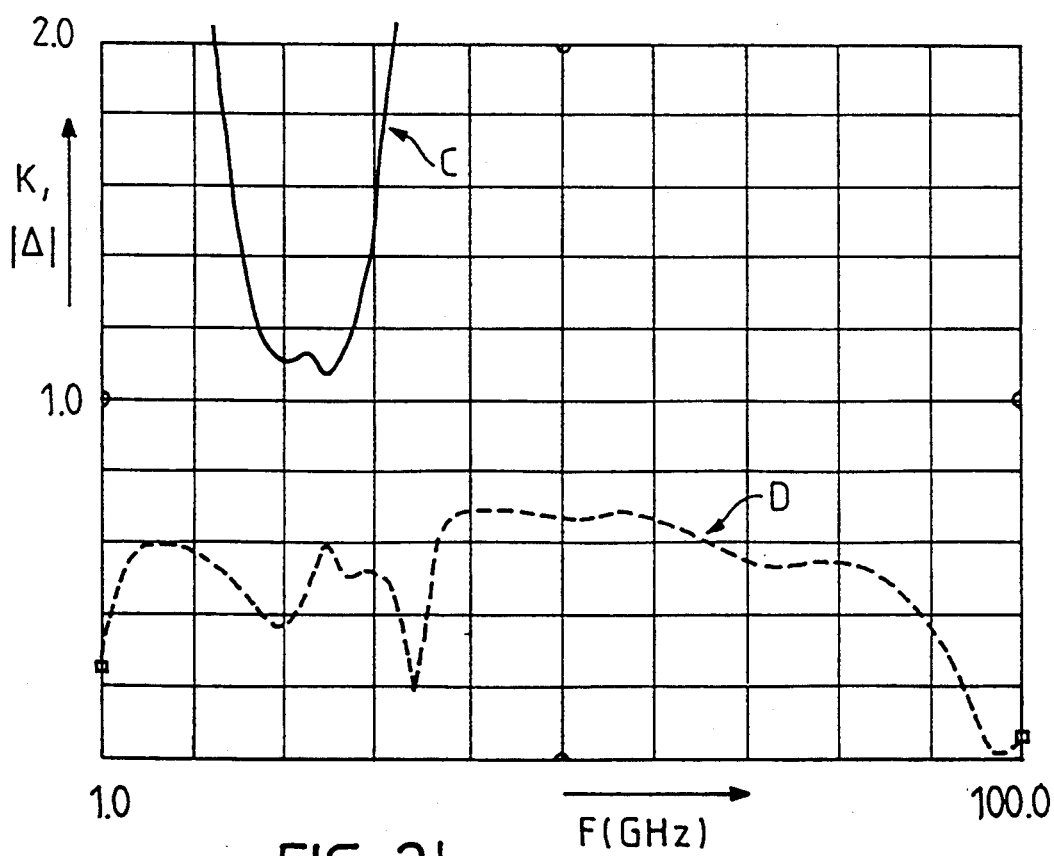
FIG. 2b shows by comparison a curve representing the stability factor k in a solid line (curve C) and $|\Delta|$ in a dashed line (curve D) of a circuit comprising the stabilizing circuit R2, C2 according to the invention.

With reference to FIG. 2b which shows in a solid line in curve C the stability factor k for a device such as that of FIG. 1a, comprising both a short-circuit formed by a radial stub SL and the stabilizing circuit R2, C2, it appears that the factor k always remains much higher than the critical value of "1" and that the circuit is unconditionally stable in the domain of the operating frequency F situated between 1 and 100 GHz.

With reference to FIG. 2b, which shows in a dashed line in curve D the parameter $|\Delta|$, it appears that due to the bias circuit R2, C2 there is no longer an undesirable resonance peak in the domain of the operating frequency F situated between 1 and 100 GHz.

As is known to the person skilled in the art, the relationship between the stability factor k and the stability parameter $|\Delta|$ is:

$$k = \frac{1 + |\Delta|^2 - |S11|^2 - |S22|^2}{2\,|S12|\,|S21|}$$

We claim:

1. A semiconductor device including a microwave integrated circuit with at least a transistor stage which comprises: a microwave matching circuit and a d.c. bias circuit interconnected at a link node, and stabilizing means which include an open sub connected to said link node, wherein the open stub comprises a λ/4 line at the operating frequency of the transistor stage and connected so as to impose a short-circuit to ground on said link node at said operating frequency, and said stabilizing means include a stabilizing circuit comprising a low-value resistor connected to ground in the microwave mode through a d.c. blocking capacitor and connected to the link node, wherein the short-circuit to ground by said open stub at the operating frequency effectively isolate the d.c. bias circuit and the stabilizing circuit from the transistor stage, and at frequencies other than the operating frequency the stabilizing circuit is effectively coupled to the transistor stage so as to practically short-circuit the link node to ground and thereby terminate any circuit oscillations.

2. The device as claimed in claim 1, wherein the λ/4 open stub line is of the radial type.

3. The device as claimed in claim 2 wherein said λ/4 radial type line comprises a metallized radial stub which is shaped as a sector of a circle having its center positioned at the link node, wherein the length of the peripheral arc and the length of the radius of said sector are each λg/4, where λg is the wavelength at the circuit operating frequency.

4. The device as claimed in claim 1 wherein the transistor stage comprises:
  an input terminal for a microwave signal,
  a transistor having a control electrode coupled to said input terminal and to said link node via said matching circuit, a first main electrode coupled to a point of reference voltage, and a second main electrode coupled to an output terminal of the transistor stage, and wherein
  the stabilizing circuit which comprises said low-value resistor and said blocking capacitor is coupled between said link node and ground.

5. The device as claimed in claim 4 wherein said d.c. bias circuit comprises a resistor connected between said link node and a terminal for a d.c. bias voltage, and said transistor is a field effect transistor.

6. The device as claimed in claim 4 wherein said $\lambda/4$ open stub line comprises a $\lambda/4$ radial stub.

7. The device as claimed in claim 4 wherein said matching circuit comprises:
  a first transmission line coupled between said input terminal and said transistor control electrode, and
  a second transmission line coupled to said input terminal and to said link node.

8. A high frequency amplifier circuit comprising:
  an input terminal for a band of high frequency signals encompassing an operating frequency and which are to be amplified by the amplifier circuit,
  a high frequency transistor amplifier having a control electrode and first and second main electrodes,
  a d.c. bias circuit for the high frequency transistor amplifier,
  an impedance matching circuit coupling said transistor amplifier control electrode to said input terminal and to a link node,
  a $\lambda/4$ line for short circuiting said link node to ground at the operating frequency having a wavelength $\lambda$,
  first means coupling said $\lambda/4$ line and said bias circuit to said link node,
  a stabilizing circuit comprising an RC circuit coupled to said link node and to a ground point and operative so as to effectively attenuate oscillations at frequencies outside of said high frequency signal band, and
  second means coupling said transistor first and second main electrodes to a point of reference voltage and to a circuit output terminal, respectively.

9. The amplifier circuit as claimed in claim 8 wherein said $\lambda/4$ line comprises a $\lambda/4$ radial stub.

10. The amplifier circuit as claimed in claim 8 wherein said $\lambda/4$ short circuit line is operative to effectively isolate the stabilizing circuit from the high frequency transistor amplifier at said operating frequency and allows the stabilizing circuit to provide a low impedance path between the link node and ground at frequencies outside the high frequency signal band so as to attenuate oscillations at said outside frequencies.

11. The amplifier circuit as claimed in claim 10 wherein said oscillation at outside frequencies are attenuated by coupling same to ground via a low impedance path comprising said RC circuit.

12. The amplifier circuit as claimed in claim 8 wherein said impedance matching circuit comprises:
  a first transmission line coupled between said input terminal and said transistor control electrode, and
  a second transmission line coupled to said input terminal and to said link node.

13. The amplifier circuit as claimed in claim 8 wherein said RC circuit comprises a series circuit including a low resistance value resistor and a capacitor coupled between said link node and ground.

* * * * *